United States Patent [19]

Lafonta et al.

[11] Patent Number: 4,560,914
[45] Date of Patent: Dec. 24, 1985

[54] HIGH VOLTAGE AMPLIFIER FOR CAPACITIVE LOAD

[75] Inventors: Fernande F. Lafonta; Paul A. Lafonta, both of Paris, France

[73] Assignee: ETAT Francais, Paris Armees, France

[21] Appl. No.: 590,768

[22] Filed: Mar. 19, 1984

[30] Foreign Application Priority Data

Mar. 18, 1983 [FR] France ............... 83 04431

[51] Int. Cl.$^4$ .............. H03G 3/00; H04R 19/01; H03F 1/42; H02J 1/00
[52] U.S. Cl. ..................... 320/1; 307/109; 330/7; 330/127
[58] Field of Search .............. 320/1, 7; 330/127, 7; 307/109; 250/377, 378; 378/102, 103

[56] References Cited

U.S. PATENT DOCUMENTS

| | | | |
|---|---|---|---|
| 3,260,920 | 7/1966 | Shoemaker | 320/1 X |
| 3,263,099 | 7/1966 | Bedford | 320/1 X |
| 3,560,842 | 2/1971 | Caprari | 320/1 X |
| 3,579,074 | 5/1971 | Richell | 320/1 |
| 4,160,996 | 7/1979 | Nigra et al. | 320/1 X |

FOREIGN PATENT DOCUMENTS 58-25705 2/1983 Japan ..................... 320/7

Primary Examiner—R. J. Hickey
Attorney, Agent, or Firm—Parkhurst & Oliff

[57] ABSTRACT

A controlled supply device for a capacitive load with high voltage signals includes a circuit that produces an alternate low voltage control signal, an input capacitor which displays a capacitance which is much lower than that of the capacitive load, a non-linear high voltage element comprising an active tripole with a control dipole, where one of the poles of the control dipole is connected to the input capacitor while the other pole of the control dipole is connected to the output capacitive load, and a quick low leak, low capacitance diode which is connected between the two poles of said control dipole so as to comprise a closed circuit with the latter which accepts a current that flows in only one direction under normal operating conditions. The device enables real time control of the high voltage signal that is applied to the capacitive load.

15 Claims, 8 Drawing Figures

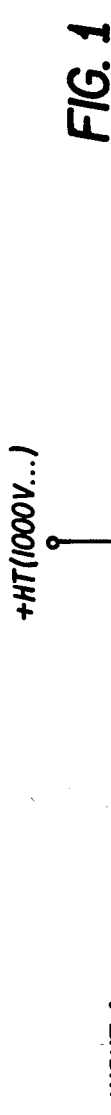
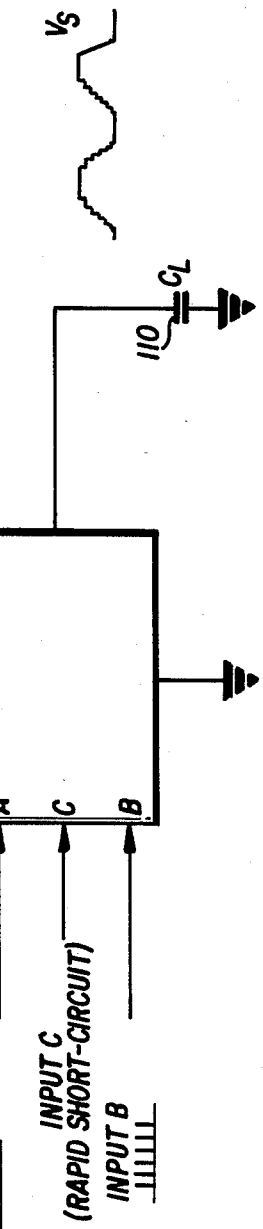
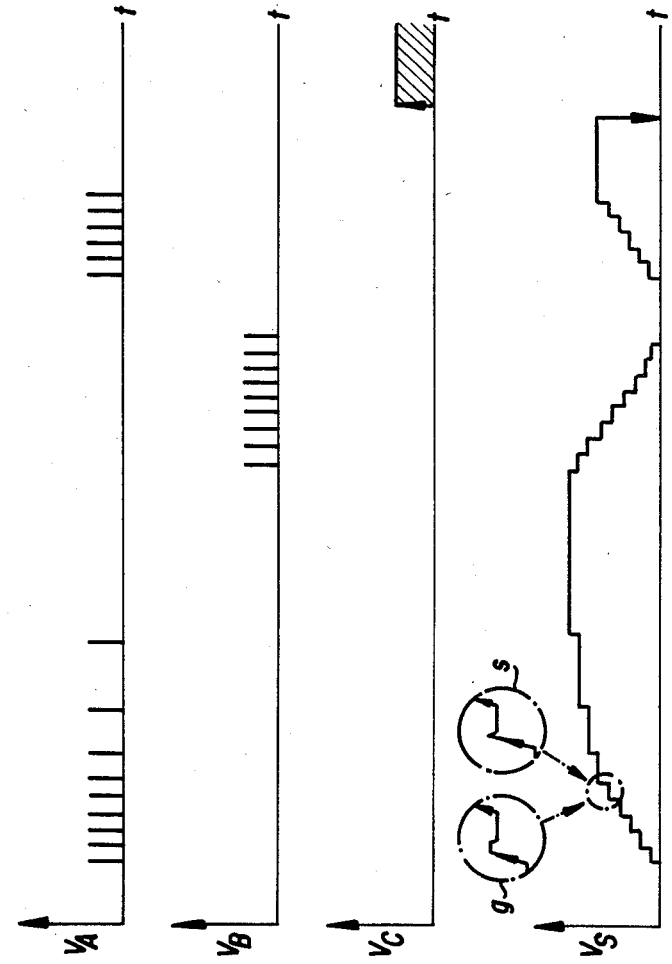

HIGH VOLTAGE AMPLIFIER FOR CAPACITIVE LOAD

FIELD OF THE INVENTION

This invention pertains to a high voltage amplifier for capacitive loads and especially to a controlled supply device of an appreciable capacitive charge having large amplitude voltage signals which can, for instance, equal about one kilovolt.

BACKGROUND OF THE INVENTION

It is often necessary to supply capacitive loads, such as an electrical amplifier, a Geiger-Muller tube, or an ultrasound transducer, with a high voltage supply. For certain specific applications, it is also necessary to tie the voltage level applied to the capacitive load, and possibly the profile of the applied voltage, to an input signal, which can evolve very quickly.

Capacitive charge attack circuits which must be supplied with high voltage signals in a controlled manner generally combine quick all or nothing switching circuits with varying structures that require significant power. However, the known capacitive load supply circuits are ill-adapted to the execution of real time control of voltages of about one kilovolt with variation ranges of about a dozen or so microseconds. In most known circuits, weak output impedance can prove to be very dangerous for the user and auxiliary protection circuits must be included to guard against short circuits. Moreover, with traditional supply circuits, high voltage is automatically present on the output terminal, even when no load is connected, which is unsatisfactory for safety reasons.

SUMMARY OF THE INVENTION

This invention is designed to remedy the previously mentioned disadvantages and to make it possible to achieve a high voltage amplifier for a capacitive load that displays a pronounced gain in power, little cumbersomeness and low cost which provides a real time voltage control potential, and allows easy adjustment of the variation profile of the applied voltage, without adding resistance; and that is energy saving and provides a high degree of safety during use.

These goals are reached with a controlled supply device for a capacitive load with high voltage signals. The device supplies a voltage signal which may be increased or decreased in a stepwise fashion. In conformity with the invention, the device includes a circuit for the output of an alternate low voltage command signal and an input capacitor to one of the terminals of which the alternate command signal is applied. This input capacitor has a capacitance that is much lower than that of the capacitive load. A non-linear element is provided and supplied under high voltage. It comprises an active tripole with a command dipole. One of the poles of the command dipole is connected to the second terminal of the input capacitor, while the other pole of the command dipole is connected to one of the terminals from the output capacitive load, the other terminal of which is connected to ground. A rapid low-leak, small capacitance diode is connected between the two poles of the command dipole so as to comprise with the dipole a closed circuit that accepts current circulating in only one direction under normal operating conditions.

Preferably, the circuit for the output of an alternate low voltage command signal includes a low voltage impulse generator which provides fairly rectangular impulses the height and width of which determine the size the steps in the voltage signal to be produced at the device's output terminals.

The active tripole may be advantageously comprised of a field effect transistor field effect of the V-MOS type, and the diode that is connected between the two poles of the command dipole of the active tripole may be comprised of a rapid Zener diode of which the Zener elbow voltage is greater than the cutoff voltage of the active tripole.

According to one possible embodiment, the grind of the field effect transistor is connected to the input capacitor while the source is connected to the output capacitive load.

According to another possible embodiment, the source of the field effect transistor is connected to the input capacitor while the grid is connected to the output capacitive load.

In order to allow rapid discharging of the capacitve load, the device includes means to short-circuit the output capactive load. The short circuit means are connected between the terminal of the input capacitor that is linked to the active tripole and to ground. As an example, the short-circuiting means may include a resistor in series with the drain-source area of a field effect transistor that is controlled by a grid. The capacitive load may then be discharged through the transistor by sending the appropriate signal to the grid.

In order to make it possible to achieve a gradual and controlled discharging of the capacitive load, the device also includes a controlled discharge circuit. The controlled discharge circuit is connected to a second impulse generator which provides fairly rectangular impulses that allow the discharge control circuit to discharge the capacitive load a step at a time, with one step per impulse. The width of each step thus corresponds to the period of the impulses stemming from the second impulse generator.

According to a preferred embodiment, the controlled discharge circuit includes a second input capacitor to one of the terminals of which the signal from the second impulse generator is applied. Also included in a non-linear element comprisng a second active tripole with a low leak, low capacitance diode creating a control dipole similar to that of the first tripole, including allowing current flow in only one direction. One of the poles of the second control dipole is connected to the second terminal of the second input capacitor, while the other pole of the second control dipole is connected to one of the terminals of a discharge capacitor. The other terminal of the discharge capacitor is connected to ground. Also provided is a voltage reference or clipping element, the reference voltage of which is lower than the maximum amplitude of the impulses supplied by the second impulse generator. The clipping element is connected to the second control dipole in parallel with the discharge capacitor. Finally, the third pole of the second active tripole is connected to the terminal of the capacitive load which is connected to one of the poles of the first control dipole.

By using low input voltage signals with a high voltage integrating amplifier, the device of the present invention can generate a high voltage output which may be increased or decreased in a step-wise fashion by adjusting the input signals. In use, an initial current-frequency converter issues low voltage impulses with a preset height and frequency. These signals control the application to the output capacitive load of an increasing step voltage. The height and width of the steps correspond respectively to the amplitude and the period of the impulses that are issued by the first current-frequency converter. A second current-frequency converter also issues low voltage impulses with a preset height and frequency in order to control the application to the output capacitive load of a decreasing step voltage. Again, the width of the steps corresponds to the period of the impulses issued by the second current-frequency converter.

The circuit which actually applies the increasing step voltage to the output capacitive load includes an input capacitor to which the signal impulses from the first current-frequency converter are applied, an active tripole with the poles of its control dipole connected to the input capacitor and to the output capacitive load and its third pole connected to a high voltage supply, and a rapid diode connected between the two poles of said control dipole so as to create a closed circuit with the latter that accepts current which circulates only in one direction.

The circuit which actually applies the decreasing step voltage to the output capacitive load includes an input capacitor to which the signal impulses from the second current-frequency converter are applied, an active tripole with the poles of its control dipole connected to the input capacitor and to a discharge capacitor and its third pole connected to the output capacitive load, a rapid diode connected between the two poles of the control dipole so as to comprise a closed circuit with the latter that accepts current which circulates in one direction only, and a voltage reference or clipping element connected in parallel with the discharge capacitor.

Other characteristics and advantages of the invention will emerge in the description of the preferred embodiments which follows.

DESCRIPTION OF THE DRAWINGS

The preferred embodiments of the present invention will be described with reference to the following drawings, in which like numbers designate like items:

FIG. 1 is a broad schematic diagram which shows the frequency control of the high voltage amplifier according to the invention;

FIGS. 2a through 2d are comparative temporal diagrams of input and output signals of the circuit in FIG. 1;

DETAILED DESCRIPTION OF THE INVENTION

Figure 3:
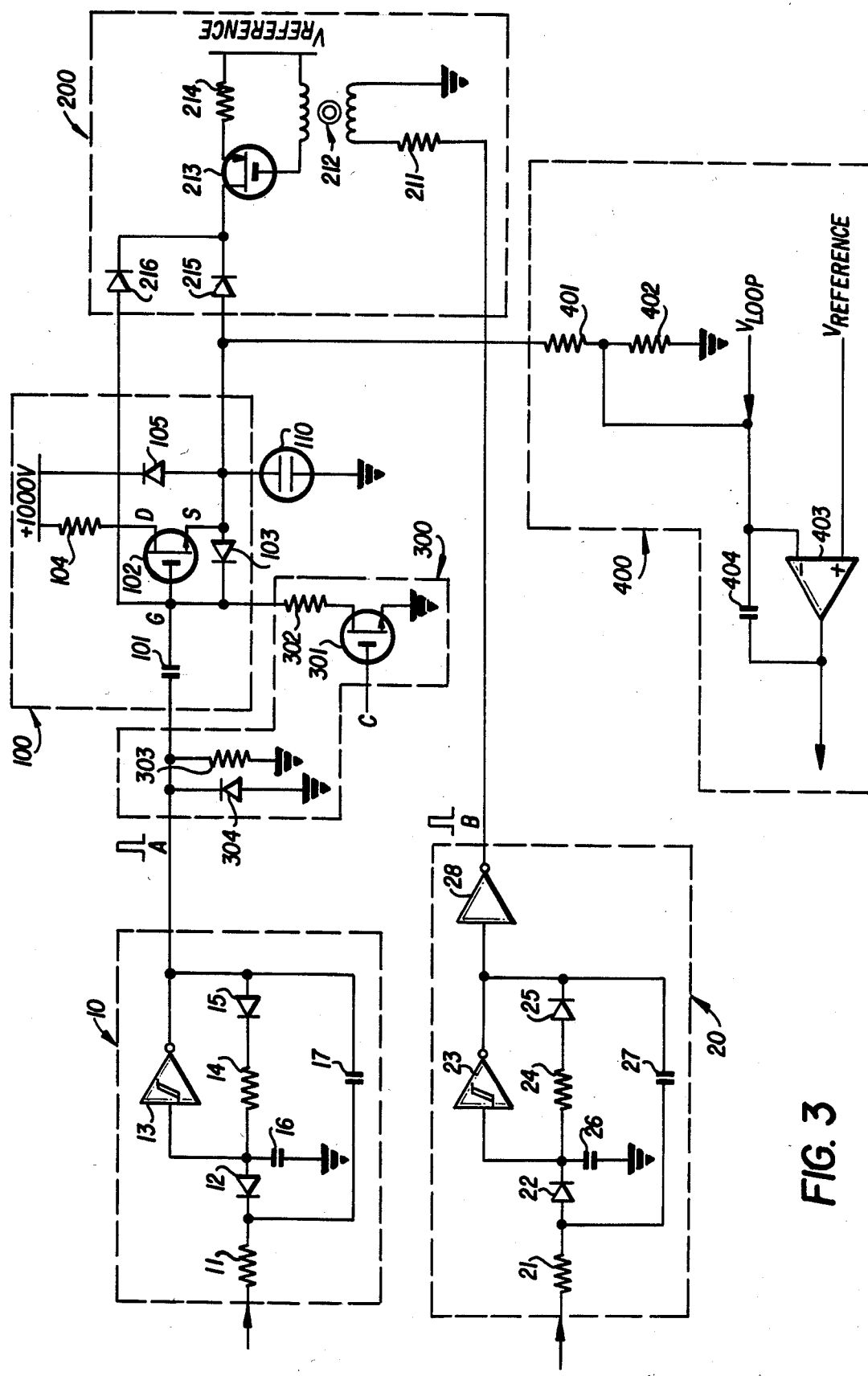
FIG. 3 is a detailed schematic diagram of one embodiment of the present invention.

FIG. 1 represents an amplifier according to the present invention which is designed to apply to a pure or nearly pure capacitive load 110 a voltage signal $V_s$. The amplitude of the signal $V_s$ is alternately increasing and decreasing between a value of zero or a very low one and a maximum value in the range of one kilovolt, for example. The variations in the output voltage $V_s$ are controlled from inputs A, B, C which receive low voltage signals. The high voltage supply source is connected to an independent terminal E of circuits 100, 200, 300, which circuits will be described in detail below.

An alternate signal $V_A$ which is comprised of impulses with a pre-set amplitude and frequency is applied on the input A to control the evolution of the rising sides of the output signal $V_S$. As may be seen in FIGS. 2a and 2d, the rising side of the output signal $V_S$ is made up of a series of step-wise increases. The width of the impulses $V_A$ and the width of the steps correspond to the time interval between two successive impulses, or to the period of the signal $V_A$. The steepness of the rising side of the signal $V_S$ can be adjusted by a change in the frequency of input impulses $V_A$. In a similar way, FIGS. 2b and 2d show how the descending sides of the output signal $V_S$ are made up of a series of step-wise decreases. The height of the steps corresponds approximately to the amplitude of the impulses $V_B$ which are applied on input B and the width of the steps correspond to the time interval between two successive impulses, or to the period of the signal $V_B$. In some cases, it is desirable to be able to return the value of the voltage at the terminals of the condenser load 110 to zero instantly. In that case, a voltage step $V_C$ applied to input C produces a rapid short-circuit effect, so that the descending side of the signal $V_S$ is nearly vertical.

A more detailed description of a preferred embodiment of the present invention will be made with reference to FIG. 3, in which certain portions of the total device have been set off by dashed lines. These portions include a voltage supply circuit 100 for a capacitive load 110, a frequency control circuit 10 for the voltage supply circuit 100, a circuit 300 for short-circuiting the capacitive load 110, a controlled discharge circuit 200 for discharging the capacitive load 110 in a step-wise fashion, a frequency control circuit 20 for the discharge circuit 200 and an adjustment loop 400.

The circuits 10 and 20 represent impulse generators which produce impulses having a fairly rectangular shape, with pre-set amplitude and frequency. In the anticipated application, the width of the control impulses themselves do not affect the characteristics of the output signal $V_S$ of the circuit 100, so long as that width is greater than a minimal value that depends on the nature of the components used. The circuits 10 and 20 can display classical configurations. In the example of FIG. 3, the circuits 10 and 20 are comprised of current-frequency converters to which analog control signals are applied and which can take into account the negative feedback signals of the adjustment loop 400.

As an example, the converter circuit 10 shown includes an input resistor 11 which is connected to the cathode of a diode 12 of which the anode is connected to a Schmidtt trigger 13, to an end of a resistor 14 and to a terminal of a capacitor 16 of which the other terminal is connected to ground. The second end of the resistor 14 is connected to the cathode of a second diode 15 the anode of which is connected to the output the Schmidtt trigger 13. A capacitor 17 connects the output of the Schmidtt trigger 13 to the cathode of the diode 12. The converter circuit 20 includes elements 21 through 27 which are respectively similar to elements 11 through 17 of the converter circuit 10. However, in order to take into account the different polarities of the analog input signal, the branching direction of the diodes 22 and 25 is reversed. An additional inverter 28 makes the polarity of the output impulses of the converter circuit 20 similar to that of the impulses from the converter circuit 10.

The voltage supply circuit 100 of the capacitive load 110 represents an important aspect of this invention. The circuit 100 is constructed around a non-linear element which comprises an active tripole 102. This active tripole can be comprised of a dipole junction transistor, an assembly of the Darlington type, or a no-load tube, but is preferably comprised of a high voltage field effect transistor of the V-MOS type. Whatever the tripole used, it should be adapted to operate under the operational voltage of the device, display no secondary breakdown, give rise to only very low leaks when closed and display both gain in increased current and inconsequential recovery time. Such a component selection makes it possible to be especially free of the disadvantages tied to recovery times and to saturation phenomena. A diode 103 is connected between the poles (grid G, source S) of the control dipole of the active tripole 102, while the third pole (drain D) is connected, through a protective resistor 104, to a high voltage supply source, which is not depicted. The diode 103 is connected so as to constitute with the control dipole G,S a closed circuit that accepts current circulating in only one direction. Thus, in the example of FIG. 3, the cathode and the anode of the diode 103 are connected to the grid and to the source of the field effect transistor 102 respectively.

The terminal of the capacitive load 110 which is not connected to ground is connected to one of the poles G,S of the control dipole of the field effect transistor 102. The other pole of the control dipole is connected to the output of the converter circuit 10 by way of an input capacitor 101. The capacitance of the input capacitor 101 is much lower than that of the capacitive load 110. The value of the capacitor 101 may be about ten to twenty times lower than that of the load 110.

As shown in FIG. 3, the field effect transistor 102 is mounted so that it can be controlled by the grid G which is connected to the input capacitor 101, the source S being connected to the load 110. In another embodiment, shown in FIG. 4, the field effect transistor 102 is mounted so that it is controlled by the source S which is connected to the input capacitor 101, while the grid G is connected to the load 110.

For best results, the diode 103 should be a rapid Zener type diode of which the Zener elbow voltage is greater than the cutoff voltage of the transistor 102. Generally speaking, the diode 103 is a rapid low leak, low capacitance diode.

The circuit means 300 for selectively short-circuiting the load 110 in order to instantly discharge it include a field effect transistor 301 of which the source is connected to ground, the drain is connected to the cathode of the diode 103 by way of a resistor 302 and the grid receives the control signals $V_C$ for quick short-circuiting. A diode 302 and a resistor 303 are connected in parallel between ground and the output of the converter circuit 10, the cathode of the diode 302 being connected to the output of the converter circuit 10.

The discharge circuit 200 receives control impulses from the converter circuit 20 and is designed to control the decreasing slope of the voltage at the terminals of the load 110. In the example of FIG. 3, the impulses from the converter circuit 20 are applied by way of a resistor 211 to the primary winding of a transformer. The secondary winding of the transformer is connected between a low voltage reference source (not shown) and the grid of a field effect transistor 213. The source of the transistor 213 is also linked by way of a resistor 214 to the low voltage reference source, and the drain is linked by diodes 215 and 216 respectively to the load 110 and to the terminal of the input capacitor 101 which is linked to the gate of the field effect transistor 102.

The adjustment loop 400 allows for negative feedback control. The output signal $V_S$ which is present at the terminals of the load 110 is applied to a divider bridge 401, 402 which supplies voltage to the inverting input of an operational amplifier 403. The non-inverting input of the operational amplifier 403 receives a reference voltage signal. A capacitor 404 is connected between the inverting input and the output of the operational amplifier 403. The negative feedback signal which is issued at the output of the adjustment circuit 400 may be used to control the signals that are applied at the input of the converters 10, 20 in a conventional way.

The operation of the device in FIG. 3 and especially of the supply circuit 100 of the load 110 is as follows:

When an impulse appears at the input A of the supply circuit 100, there is an increase in voltage on the load 110 at the front of the impulse, which cannot exceed the amplitude $V_i$ of the input impulse. The current for charging the load 110 comes from the high voltage supply through the transistor 102. During the length of the impulse, when the voltage $V_i$ of the input impulse is maintained at a constant, the voltage at the terminals of the load 110 remains constant but for leaks through the various elements 101, 102, 110. At the back of the input impulse, a small part of the load from the output capacitor 110 is restored to the input capacitor 101. The charged voltage of the capacitor 101 is approximately the same as that of the capacitor 110, but in view of the capacitance ratio between the two, the charge that is restored to the input capacitor 101 is weak and causes only a very small drop in the output voltage level $V_S$ (see the shape of the signal in detail g in FIG. 2d). $V_S$ then remains constant when the input signal $V_i$ returns in zero. $V_S$ is then increased by one step each time the rising front of another impulse arrives. Thus, it is not necessary to maintain the input control signal in order to maintain the output plateaus.

The diode 103 is provided to protect the input of transistor 102, but it also plays a role in the event of an accidental short-circuiting of the load 110, provided that the diode 103 is of the Zener type, with an elbow voltage that is greater than the cutoff voltage of the transistor 102. In this case, when there is a short-circuit of the capacitor 110 as it is charged, the input capacitor 101 is discharged through the diodes 304 and 103, which reduces the input voltage and therefore the possible output electromotive force.

Generally speaking, for a given capacitance value, the load 110 does not allow the output voltage of the supply circuit 100 to increase. Hence, in no-load situations, there can be no high voltage generated at the circuit output 100. With a resistive load, the output voltage is simply equal to about the input control voltage, and the average current which travels through the resistive load is weak. The safety advantages to this are readily apparent.

The discharge circuit 200 allows a step-wise decrease of the voltage at the terminals of the capacitive load 110. At each control impulse supplied at B by the converter circuit 20, the impulse that is transferred through the transformer 212 makes the transistor 213 conductive and enables a drop in voltage at the terminals of the capacitive load 110 by a value that is proportional to the amplitude of the impulse which is received. Both the load 110 and the input capacitor 101 are discharged in this fashion.

In addition to showing the alternative embodiment of the supply circuit 100 discussed above, FIG. 4 shows an alternative embodiment of the discharge circuit 200 which is quite similar to the charging circuit 100. The control impulse generators 10, 20, the adjustment loop 400 and the quick short-circuiting means 300 have not been shown, but may be taken as being included. While the supply circuit 100 shown is the alternate embodiment discussed above, the first embodiment discussed above could also be used. It is noted, however, that the alternate embodiment shown has the advantage of reducing the size of the voltage peak in $V_S$ at each plateau (compare details g and s in FIG. 2d).

Figure 4:
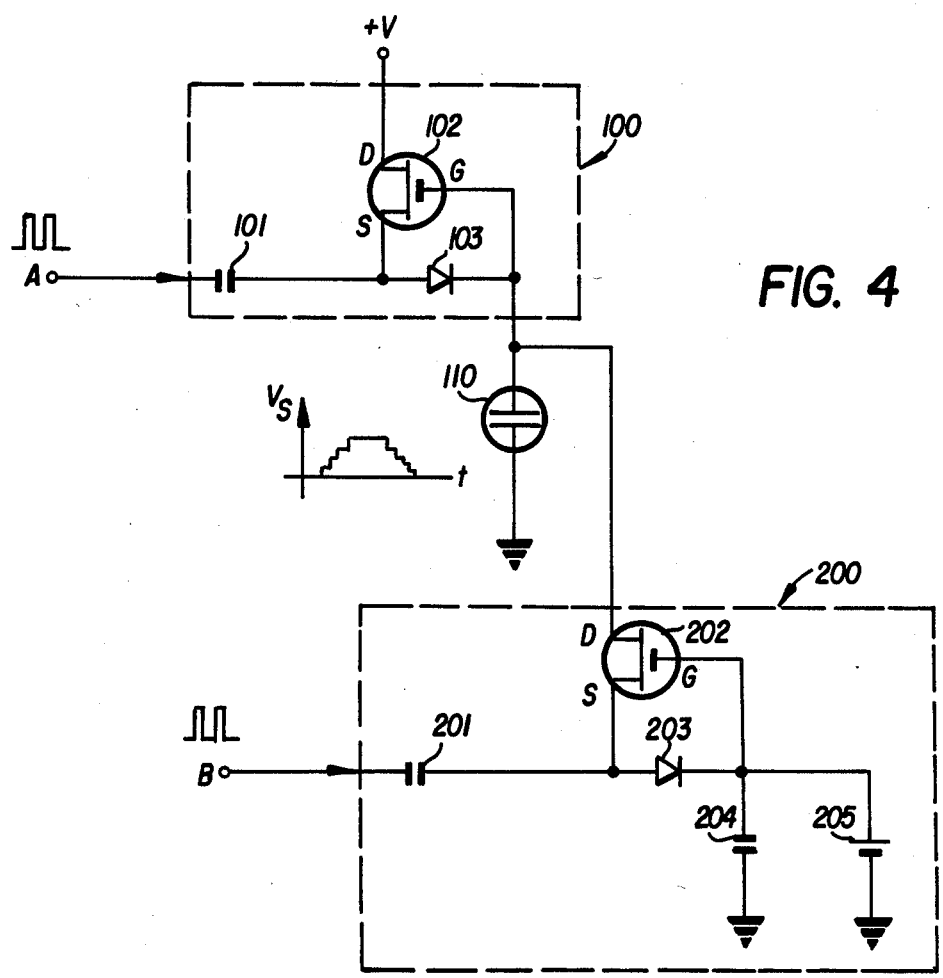
FIG. 4 is a partial schematic diagram of an alternative embodiment of the present invention.

The embodiment shown in FIG. 4 basically differs from that in FIG. 3 in that the discharge circuit 200 includes (like the supply circuit 100) an input capacitor 201, an active tripole 202, and a diode 203 that is connected between the poles (source and grid) of the control dipole of the active tripole 202. Again, the tripole is preferably a high voltage field effect V-MOS transistor. Also included is a capacitor 204 corresponding to the capacitive load 110 of the supply circuit 100. In the discharge circuit 200, the drain of the field effect transistor 202 is connected to the capacitive load 110 which, when charged, acts as a high voltage supply. A voltage reference or clipping element 205 is also included and is connected in parallel with the discharge capacitor 204. This clipping element can be a Zener diode or a low voltage supply source. If the latter, the voltage supply will be able to recover at least part of the energy of the capacitive load 110 during discharge.

Assuming the capacitive load 110 has already been charged to a high voltage level in the fashion already described, the discharge circuit 200 of FIG. 4 operates as follows: At each impulse with an amplitude $V_i$ which is applied to the input B, the capacitor 204 is charged at the rising front of the impulse, with the voltage of the capacitor 204 tending to increase in a step-wise fashion just as is the case with the capacitive load 110 when the supply circuit 100 receives impulses at A. Since the capacitive load 110 is the voltage source for the capacitor 204, this has the effective of discharging the load 110. However, as a result of the presence of the element 205 which ensures clipping of the voltage at the terminals of the capacitor 204, the voltage that is reinjected at the input capacitor 201 is restricted to a value which is approximately equal to the amplitude $V_i$ of the input impulse minus the reference voltage $V_r$ plus the elbow voltage of the diode 203. The reference voltage $V_r$ may be less than the maximum amplitude $V_i$ of impulses at B. When the level of input impulses remains constant, as in the case of circuit 100, there is no change in the voltages at the terminals of the load 110 or of the capacitor 204. However, at each descending edge of an input impulse A, the charge that is restored to the input capacitor 201 comes from the capacitive load 110 and depends on the amplitude of the impulses $V_i$ and the capacitances of the capacitors 110 and 201. The capcitor 201 is thus charged in reverse at each impulse drop with a voltage which is close to the reference voltage $V_r$. It acquires a charge that it borrowed from the load 110, which produces a voltage drop at the terminals of the load 110 equal to $C_e(V_C/C_L)$ where $C_e$ is the capacitance of the capacitor 201, $C_L$ is the capacitance of the load 110 and $V_r$ is the reference voltage of the element 205.

As already noted, when the voltage reference element 205 is a low voltage source, it recovers part of the energy in the load 110 at each rising voltage front at B. It is therefore beneficial for the voltage reference element 205 to also be the low voltage source which supplies all of the various components which comprise the amplifier, thus achieving the recovery of part of the energy which would otherwise be lost during the unloading of the capacitive load 110.

The circuit 100, 200 in FIG. 4 thus makes it possible to control entirely both the charging and discharging of the capacitive load 110 with a very small number of components, rendering the device very compact. This circuitry can also be placed in a single hybrid circuit that represents a functional module.

Figure 5:
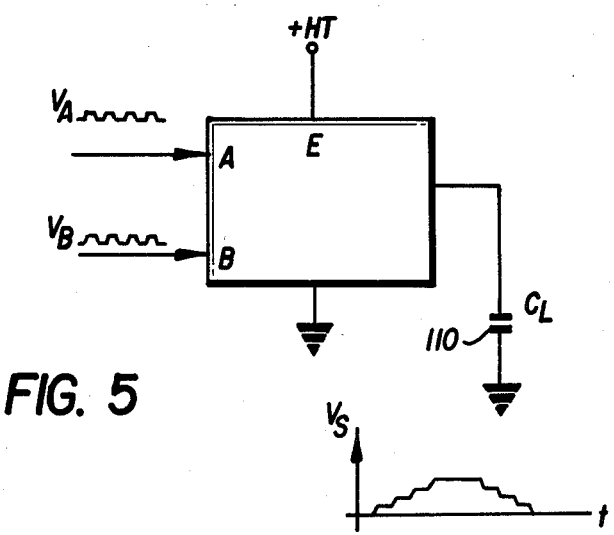
FIG. 5 represents an embodiment of the present invention to which trapezoidal input signals are applied.

In the various embodiments previously described, it was assumed that the control signals were comprised of rectangular or fairly rectangular impulses. In some cases, it is advantageous to use trapezoidal-shaped impulses (see FIG. 5), in order to restrict transient currents without adding specific components. Indeed, as a result of the presence of input capacitors 101, 201 and of the tilt in the fronts of the trapezoidal impulses, it is possible to control the transient currents through the slope of the trapezoidal impulses according to the formula $$= C(V/t)$$

where i is the current variation, C is the capacitance of the input capacitor and V/t is the slope of the trapezoidal impulse fronts.

Furthermore, it should be noted that having the control dependent upon the frequency of the impulse from the generators 10 and 20 makes it possible to act easily on parasitic oscillations either from branchings, or from the nature of the dielectric or of the electrodes in the capacitive load, by acting, as a closed loop or otherwise, on the attack frequency using the appropriate phase in relation to the oscillation phenomenon according to the desired result (e.g., cancellation of the oscillations, or reinforcement of the oscillations to trigger a softening of variations on the load). Parasitic oscillations may also be dealt with by keeping the attack frequency constant and adjusting the cyclical ratio or the width of the control impulses. The dampening or reinforcement of parasitic oscillations can thus be obtained without a specific additional circuit, by simply changing the frequency of control signals or their cyclical ratio.

As a result of its flexibility of use, the high voltage amplifier according to the present invention is well suited for the supply of electro-optical devices such as Kerr cells, liquid crystal cells, plasma panels, KDP cells, certain electro-chrome devices, ferro-electric cells (e.g., those which use lead titanoziconates, whether doped with lanthanum or not), especially in their applications with televisual devices, for stereoscopic or stroboscopic binocular vision, or to other electrooptical devices such as shutters, attenuators, image tubes and image intensifier tubes. In all cases, the use of attack circuits of the kind depicted in FIG. 3 contributes to the simplification and increased effectiveness of the application of voltage at the terminals of the capacitive load.

In the examples described above, the output voltage at the terminals of the capacitive load 110 evolves in a single pole fashion between a value close to zero and a positive high value. Quite naturally, if the active components in the conductive direction are reversed and the polarity of the voltage supply is reversed, this voltage could also evolve between a value close to zero and a high negative value, the evolution of the absolute value of the output voltage in relation to the control impulses displaying a staircase evolution in the same fashion as described above.

If two groups of circuits 100, 200 are associated and adapted respectively to the control of positive voltage drift and negative voltage drift at the terminals of the capacitive load 110, the voltage can evolve in an alternate way and comprise a two-pole signal.

Thus, according to one possible embodiment, the device according to the present invention can comprise a bridge assembly which includes two current-frequency converters 10 that are associated with two circuits 100 which apply a staircase voltage with an increasing absolute value supplied respectively by opposed polarity supply sources and two current-frequency converters 20 which are associated with two circuits 200 which apply a staircase voltage with a decreasing absolute value.

According to another possible embodiment, which only requires two high voltage application circuits in order to obtain two-pole signals on the capacitive load and makes it possible to prevent the use of components with a complementary structure, the device includes an initial current-frequency converter 10 which is associated with an initial circuit 100 for application of a staircase voltage with an increasing absolute value and a second current-frequency converter which is associated with a second circuit that applies a staircase voltage with an increasing absolute value similar to said initial circuit 100 but supplied by a high voltage which is floating in relation to ground, in a top to bottom assembly in relation to the initial circuit so as to apply two-pole signals on the capacitive load 110. In this case, the second circuit which applies a staircase voltage with an increasing absolute value that is supplied by a floating high voltage represents a discharge circuit for the capacitive load 110 which is charged by the initial circuit 100 and, vice versa, the initial circuit 100 represents a discharge circuit for the capacitive load 110 that is charged by the second circuit.

What we claim is:

1. A supply device for producing and controlling a step-wise voltage for a capacitive load, the device comprising:

circuit means for producing an alternate low voltage control signal;

an input capacitor having first and second terminals and a capacitance which is much lower than that of the capacitive load, where said alternate control signal is applied to the first terminal of said input capacitor;

a non-linear high voltage element comprising an active tripole with a control dipole, where one of the poles of the control dipole is connected to the second terminal of the input capacitor while the other pole of the control dipole is connected to one of the terminals of the input capacitive load, the other terminal of said capacitive load being connected to ground;

a low leak, low capacitance diode connected between the two poles of said control dipole so as to constitute a closed circuit with the latter which accepts current that flows in only one direction under normal operating conditions.

2. A device according to claim 1, wherein said circuit means for producing an alternate low voltage control signal comprises:

a low voltage impulse generator which issues impulses that are approximately rectangular in shape and of which the height and the period are respectively equal to the height and the width of the steps of the step-wise changing voltage which must be produced at the terminals of the capacitive load.

3. A device according to claim 1, wherein the active tripople further comprises a field effect transistor of the V-MOS type.

4. A device according to claim 1, wherein the diode connected between the two poles of the control dipole of the active tripole comprises a Zener diode of which the Zener elbow voltage is greater than the cutoff voltage of the active tripole.

5. A device according to claim 3, wherein the grid of the field effect transistor is connected to the input capacitor while its source is connected to the output capacitive load.

6. A device according to claim 3, wherein the source of the field effect transistor is connected to the input capacitor while its grid is connected to the output capacitive load.

7. A device according to claim 1, further comprising means for selectively short-circuiting said output capacitive load, said means being connected between the terminal of the input capacitor which is linked to the active tripole and ground.

8. A device according to claim 7, wherein said selective short-circuiting means comprises a resistor connected in series with the drain-source area of a field effect transistor which is controlled by a signal to its grid.

9. A device according to claim 1, further comprising controlled discharge circuit means for discharging the output capacitive load in a controlled fashion, said controlled circuit means being connected to a second impulse generator which issues impulses that enable the controlled discharge circuit means to discharge the output capacitive load in a step-wise fashion, the width of each step corresponding to the period of impulses from said second impulse generator.

10. A device according to claim 9, wherein said controlled discharge circuit means comprises:

a second input capacitor having first and second terminals, to the first terminals of which the signal from the second impulse generator is applied;

a non-linear element comprising a second active tripole having a control dipole, where one of the poles of the control dipole is connected to the second terminal of said second input capacitor while the other pole of the control dipole is connected to one of the terminals of a discharge capacitor having two terminals, the other terminal of which is connected to ground and where the third pole of said second active tripole is connected to the terminal of the capacitive load which is connected to one of the poles of the control dipole of the first active tripole;

a low leak, low capacitance quick diode connected between the two poles of the control dipole of the second active tripole so as to comprise a closed circuit with the latter which accepts current that flows in only one direction; and a voltage reference element of which the reference voltage is smaller than the maximum amplitude of the impulses supplied by the second impulse generator, and which is connected in parallel with said discharge capacitor.

11. A device according to claim 1, wherein the low voltage impulse generator issues impulses which are trapezoid-shaped.

12. A device according to claim 1, further comprising a first current-frequency converter associated with first circuit means for applying a voltage with an absolute stepwise increasing value and a second current-frequency converter associated with second circuit means for applying a voltage with an absolute stepwise decreasing value that is similar to said first circuit means but supplied by a high voltage source, the voltage of which is floating with respect to ground and assembled top to bottom in relation to the initial circuit so as to apply two-pole signals to the output capacitive load.

13. A high voltage amplifier for a capacitive load, the amplifer comprising:

a first current-frequency converter for providing low voltage impulses having a pre-set height and frequency in order to control the application to the output capacitive load of voltage increasing in a step-wise fashion, wherein the height and width of the steps correspond respectively to the amplitude and the period of the impulses that are issued by the first current-frequency converter;

a second current-frequency converter for providing low voltage impulses having a pre-set height and frequency in order to control the application to the output capacitive load of a voltage decreasing in a step-wise fashion, wherein the width of the steps corresponds to the period of the impulses that are issued by the second current-frequency converter;

first circuit means for applying said increasing voltage, said first circuit means comprising:
 an input capacitor to which the impulses from said first current-frequency converter are applied;
 an active tripole having a control dipole, wherein the poles of the control dipole are respectively connected to the input capacitor and to the output capacitive load, and wherein the third pole of said active tripole is connected to a high voltage supply; and
 a low leak, low capacitance quick diode connected between the two poles of said control dipole so as to comprise a closed circuit with the latter which accepts a current that flows in only one direction;

second circuit means for applying said decreasing voltage, said second circuit means comprising:
 a second input capacitor to which the impulses from said second current-frequency converter are applied;
 a second active tripole having a control dipole, wherein the poles of the control dipole are respectively connected to the second input capacitor and to a discharging capacitor, and wherein the third pole of said second tripole is connected to the output capacitive load;
 a quick diode connected between the two poles of the control dipole of said second tripole so as to comprise a closed circuit with the latter which accepts a circuit that flows in only one direction; and
 a voltage clipping element connected in parallel with said discharge capacitor.

14. A high voltage amplifier according to claim 13, wherein said voltage clipping element further comprises the low voltage source which supplies all of the various components which constitute the amplifier.

15. A high voltage amplifier according to claim 12, further comprising two current-frequency converters associated with two circuit means for applying a voltage with an absolute stepwise increasing value, each of said means being respectively supplied by voltage sources with opposite polarities, and two current-frequency converters associated with two circuit means for applying a voltage with an absolute stepwise decreasing value, each of said means being respectively supplied by voltage sources with opposite polarities.

* * * * *